United States Patent
Meckbach et al.

(10) Patent No.: US 11,940,346 B2
(45) Date of Patent: Mar. 26, 2024

(54) MICROMECHANICAL PRESSURE SENSOR DEVICE AND A CORRESPONDING PRODUCTION METHOD

(71) Applicant: Robert Bosch GmbH, Stuttgart (DE)

(72) Inventors: Johannes Meckbach, Tuebingen (DE); Thomas Friedrich, Moessingen-Oeschingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 508 days.

(21) Appl. No.: 17/291,244

(22) PCT Filed: Dec. 13, 2019

(86) PCT No.: PCT/EP2019/085105
§ 371 (c)(1),
(2) Date: May 4, 2021

(87) PCT Pub. No.: WO2020/126915
PCT Pub. Date: Jun. 25, 2020

(65) Prior Publication Data
US 2021/0389202 A1    Dec. 16, 2021

(30) Foreign Application Priority Data
Dec. 21, 2018  (DE) .......................... 102018222738.1

(51) Int. Cl.
*G01L 9/00*    (2006.01)
*B81B 3/00*    (2006.01)

(52) U.S. Cl.
CPC .......... *G01L 9/0073* (2013.01); *B81B 3/0078* (2013.01); *B81B 2201/0264* (2013.01); *B81B 2203/0127* (2013.01)

(58) Field of Classification Search
None
See application file for complete search history.

(56) References Cited

U.S. PATENT DOCUMENTS

| | | |
|---|---|---|
| 4,996,627 A | 2/1991 | Zias et al. |
| 2001/0021538 A1 | 9/2001 | Aigner et al. |

(Continued)

FOREIGN PATENT DOCUMENTS

| | | |
|---|---|---|
| CN | 101426718 A | 5/2009 |
| CN | 101881676 A | 11/2010 |

(Continued)

OTHER PUBLICATIONS

International Search Report for PCT/EP2019/085105 dated Apr. 17, 2020.
W. P. Eaton et al, "Micromachined Pressure Sensors: Review and Recent Developments" Smart Materials and Structures, vol. 6, pp. 530-539, 1997.

Primary Examiner — Michelle Mandala
(74) Attorney, Agent, or Firm — NORTON ROSE FULBRIGHT US LLP; Gerard A. Messina

(57) ABSTRACT

A micromechanical pressure sensor device including a semiconductor base substrate of a first doping type on which an intermediate layer of the first doping type is situated, a cavity sealed by a sealing layer of a second doping type and including a reference pressure, a first grating of the second doping type, suspended inside the cavity on a buried connection region of the second doping type, the buried connection region laterally extending away from the cavity into the semiconductor base material, a second grating of the second doping type, situated on a side of the diaphragm region pointing to the cavity and suspended on the diaphragm region, the first grating and the second grating being electrically insulated from each other and forming a capacitance, a first connection electrically connected to the first grating via the buried connection region, and a second connection electrically connected to the second grating.

14 Claims, 16 Drawing Sheets

(56) References Cited

U.S. PATENT DOCUMENTS

| | | | |
|---|---|---|---|
| 2004/0163476 A1 | 8/2004 | Partridge et al. | |
| 2012/0042731 A1* | 2/2012 | Lin | G01L 9/0073 29/830 |
| 2012/0186354 A1* | 7/2012 | Okada | G01L 9/0073 257/E21.001 |
| 2014/0338459 A1* | 11/2014 | Besling | G01L 19/148 73/718 |
| 2015/0061049 A1 | 3/2015 | Weber | |
| 2015/0198493 A1* | 7/2015 | Kaelberer | G01P 15/0802 73/718 |
| 2016/0088402 A1* | 3/2016 | Hu | H04R 19/005 381/174 |
| 2016/0327446 A1* | 11/2016 | Classen | G01L 19/0636 |

FOREIGN PATENT DOCUMENTS

| | | |
|---|---|---|
| CN | 102056839 A | 5/2011 |
| CN | 104634501 A | 5/2015 |
| CN | 104995496 A | 10/2015 |
| CN | 105247331 A | 1/2016 |
| CN | 104155035 B | 6/2016 |
| CN | 107265395 A | 10/2017 |
| EP | 2871456 A1 | 5/2015 |
| EP | 2994733 B1 | 1/2018 |
| GB | 2435544 A | 8/2007 |

\* cited by examiner

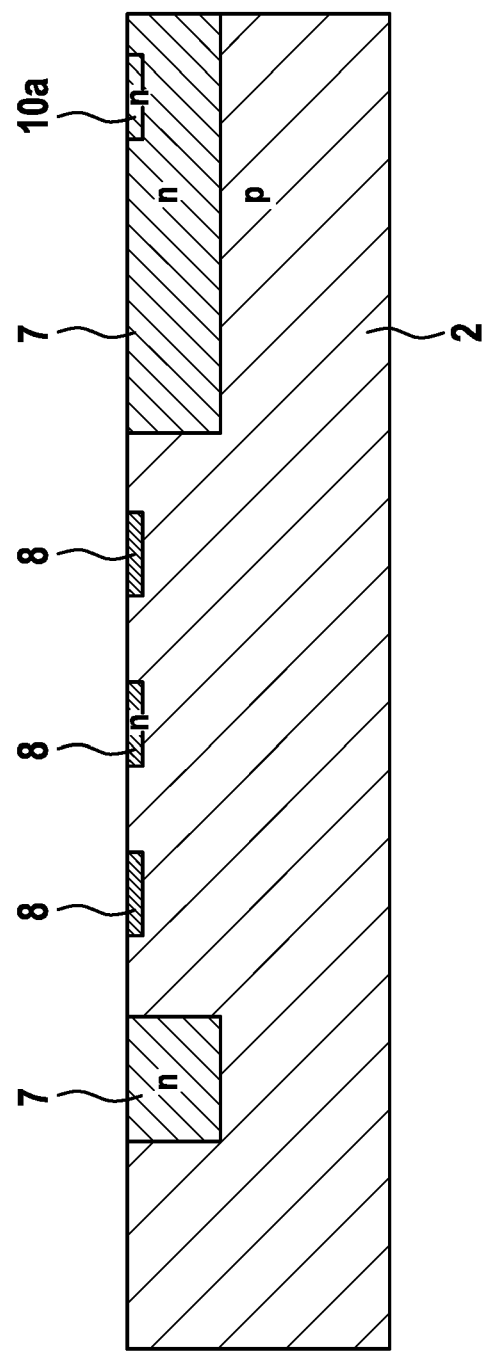

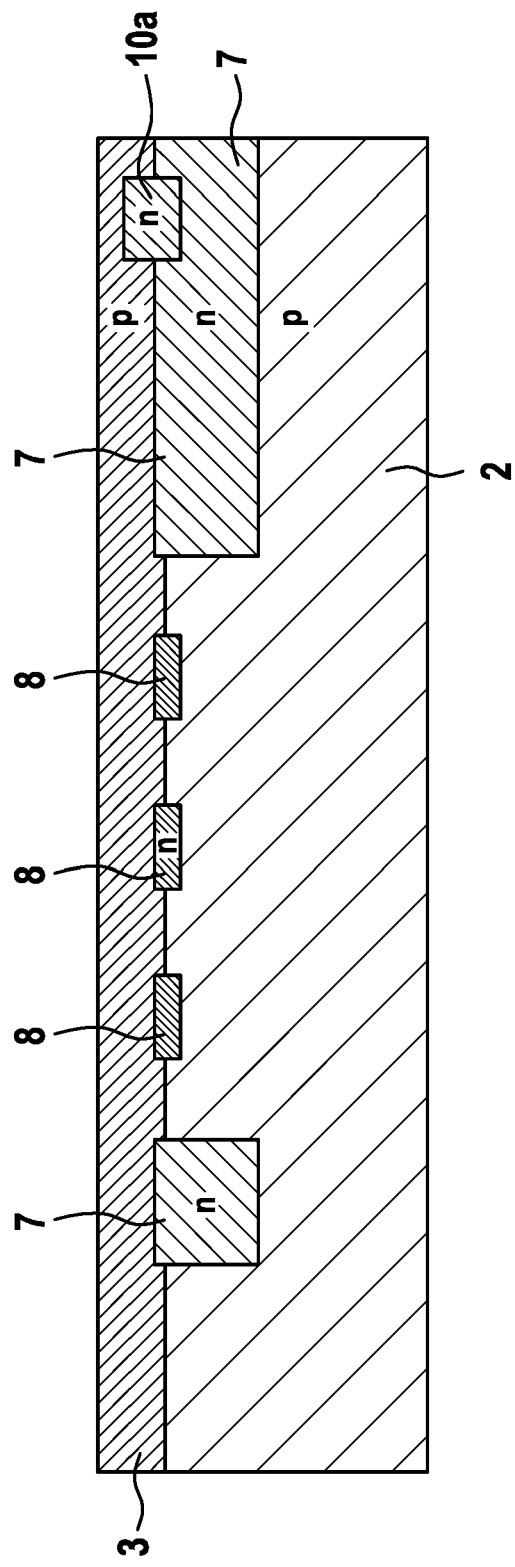

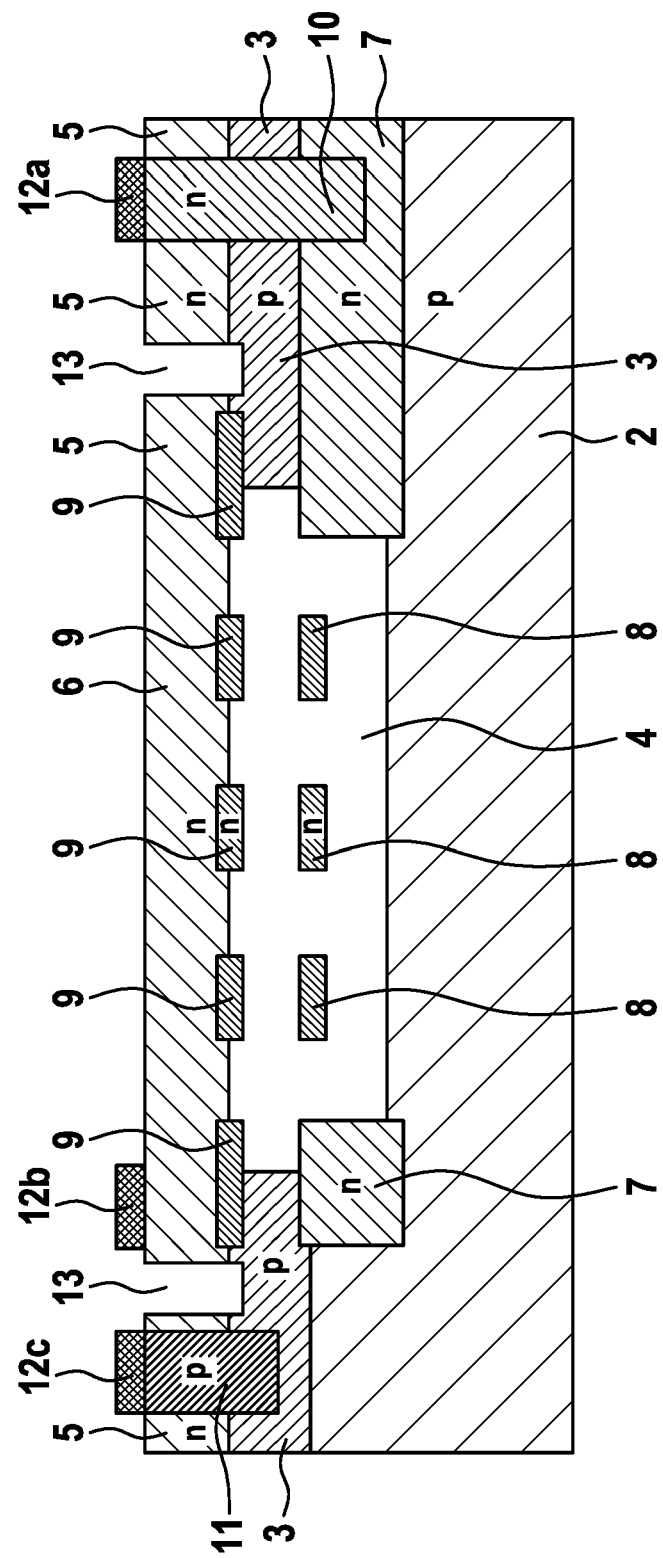

MICROMECHANICAL PRESSURE SENSOR DEVICE AND A CORRESPONDING PRODUCTION METHOD

FIELD

The present invention relates to a micromechanical pressure sensor device and to a corresponding production method.

BACKGROUND INFORMATION

For a few years now, micromechanical pressure sensors are used for an integration into airbags or smartphones, for instance, because their small size makes them particularly suitable for this purpose. The pressure sensors can be subdivided into multiple groups of different read-out methods, of which pressure sensors using piezo-resistive and capacitive read-out methods are the most typical representatives. The article by W. P. Eaton et al, "Micromachined Pressure Sensors: Review and Recent Developments" Smart Materials and Structures, vol. 6, pp. 530-539, 1997, summarizes important designs and methods of functioning.

For example, a capacitive pressure sensor normally has a plate-type capacitor, which may include a cavity that features a reference pressure and in which one of the two electrodes forms a pressure-sensitive diaphragm. This diaphragm deforms in response to a change in the ambient pressure, which means that the capacitance of the plate-type capacitor changes. This capacitance is able to be converted into a voltage signal with the aid of an external switching circuit so that the pressure change is ultimately able to be detected.

However, the small size of the micromechanical pressure sensors also poses great technical challenges. One difficulty often is the use of a combination of different materials, e.g., silicon with an oxide or a nitride, because their different coefficients of expansion have an adverse effect on the temperature response and generate internal stress in the material, which affects the measuring accuracy.

Conventional methods for the production of such pressure-sensitive diaphragms are fusion bonding of SOI material including a transfer of the function layer, or the sacrificial layer technique by a perforated diaphragm with subsequent sealing. The former has the advantage of a monocrystalline silicon diaphragm but the disadvantage of using expensive SOI material. Oxides are normally used in the sacrificial layer technology.

European Patent Nos. EP 2994733 B1 and EP 2871456 A1 describe examples of capacitive pressure sensors addressing similar problems.

SUMMARY

The present invention provides a micromechanical pressure sensor device and a corresponding production method. Preferred further refinements and example embodiments of the present invention are disclosed herein.

In accordance with an example embodiment of the present invention, a buried grating of doped silicon within a cavity acts as a pressure-insensitive counter electrode with respect to the grating situated above and mounted on the pressure-sensitive diaphragm, in this way allowing for the construction of a capacitively evaluated pressure sensor. The cavity is produced using the APSM method (advanced porous silicon membrane) in which porous silicon is initially formed as the sacrificial layer by anodizing, which is dissolved out in a following process step. The cavity is sealed by a monocrystalline sealing layer, which is grown epitaxially.

A special advantage when using the APSM method is the resulting pressure-sensitive diaphragm of monocrystalline silicon, which can otherwise be produced only via a fusion bonding of SOI material, which is a considerably more expensive method. A monocrystalline diaphragm without further layers of other materials is advantageous in particular because of the identical coefficients of expansion in the temperature response.

Additional advantages of a thereby produced pressure sensor made completely of silicon are the avoidance of waste, a simple integration of an unchanging reference capacitance, which is able to be produced by inserting support points in the diaphragms, and an adaptation and control of the sensitivity via the extension and the thickness of the diaphragm layer.

According to a preferred further development of the present invention, a first countersink of the second doping type extends from the buried connection region through the intermediate layer and electrically connects the first connection to the first grating. In this way, an electrical connection from the first grating, which is suspended at the buried layer, is able to be produced via the first countersink to the surface, which makes it possible to electrically connect the first grating situated within the cavity to the surface at a connection.

According to a further preferred refinement of the present invention, a second countersink of the first doping type extends from the intermediate layer through the sealing layer and electrically connects a third connection to the intermediate layer. In this way it is possible to electrically connect the intermediate layer via the second countersink to the third connection in order to thereby apply a reference potential to all regions of the first doping type. This ensures that all junctions between regions of the first doping type and the second doping type have an electric blocking effect.

According to a further preferred refinement of the present invention, a first insulation trench is situated circumferentially around the diaphragm region and electrically insulates the first connection from the second connection. This insulation trench thus generates capacitance C between the first grating and the second grating via which a pressure difference between the external pressure and a reference pressure enclosed in the cavity is able to be read out. The insulation trench is preferably produced by an alternating etching and passivation method.

According to a further preferred refinement of the present invention, a third countersink of the first doping type is situated circumferentially around the diaphragm region or around the second countersink, which electrically insulates the first connection from the second connection. The third countersink is an alternative solution to the insulation trench for insulating the two connections. The third countersink may extend either around the pressure-sensitive diaphragm or around the second countersink. This further development thus likewise generates capacitance C between the first grating and the second grating, via which the pressure difference is able to be read out.

According to a further preferred refinement of the present invention, a second insulation trench is situated circumferentially around the second countersink and electrically insulates the first connection from the second connection. This system is a further insulation option between the first connection and the second connection. It is able to be realized by the second insulation trench, which is situated around the second countersink. This further refinement thus also allows for capacitance C between the first grating and the second grating, via which the pressure difference is able to be read out.

According to a further preferred refinement of the present invention, a protective layer is situated on the sealing layer, the connections being routed through the protective layer. This protective layer protects the diaphragm region in particular from environmental effects, which could cause a contamination of the diaphragm. Such contaminations on the pressure-sensitive diaphragm would lead to falsified measuring results and render the sensor unusable. Contaminations caused by the environment in the region of the connections could lead to a short-circuit between the respective connections, which would make the pressure sensor ineffectual in its function.

According to another preferred further refinement of the present invention, an insulation layer is situated between the sealing layer and the protective layer, the connections being routed through the protective layer and the insulation layer. The insulation layer used in this instance prevents undesired currents between the sealing layer and the edges of the connections, which would result in a falsification of the measuring results.

According to another preferred further refinement of the present invention, the protective layer and the insulation layer are situated outside the diaphragm region on the sealing layer. If there is only a low risk of environmentally-induced contaminations on the diaphragm layer, then this further development is to be preferred because the pressure-sensitive diaphragm of monocrystalline silicon remains in this way. This ensures that the sensor has an advantageous temperature response.

According to another preferred further refinement of the present invention, the first countersink is phosphorous doped, and the buried connection region, the first grating and the second grating are antimony doped or arsenic doped. This ensures that the corresponding layers propagate as planned during the diffusion processes. This is so because this choice of doping materials makes it possible for the light phosphor atoms to propagate into the respective layers through the diffusion so that a cohesive countersink is produced, while the antimony or arsenic doping atoms of the buried connection region and the first and the second grating do not propagate at all or only to a slight degree during the diffusing on account of their greater weight.

According to another preferred further refinement of the present invention, the diaphragm region is developed from monocrystalline silicon. This ensures the advantageous temperature response by which the pressure sensor supplies precise measuring values that are largely independent of its operating temperature.

According to an additional preferred refinement of the present invention, the production method includes the implanting of a first part of the first countersink on the laterally extending portion of the connection region; the out-diffusion of the first part of the first countersink within the connection region and into the intermediate layer; the implanting of a second part of the first countersink in the intermediate layer above the first part of the first countersink; and the out-diffusing of the second part of the first countersink within the intermediate layer and into the sealing layer. In this way, the first countersink mentioned in a previous further refinement is able to be produced, which allows for the contacting of the first grating at the surface.

According to another preferred refinement of the present invention, the production method includes an implanting of a first part of the second countersink on the intermediate layer; an out-diffusing of the first part of the second countersink within the intermediate layer and into the sealing layer; an implanting of a second part of the second countersink into the sealing layer above the first part of the second countersink, and an out-diffusion of the second part of the second countersink within the sealing layer. This makes it possible to produce the second countersink mentioned in a previous refinement, which allows for the contacting of the intermediate layer at the surface.

Further features and advantages of the present invention will be described with the aid of embodiments with reference to the figures.

DETAILED DESCRIPTION OF EXAMPLE EMBODIMENTS

Figure 1:
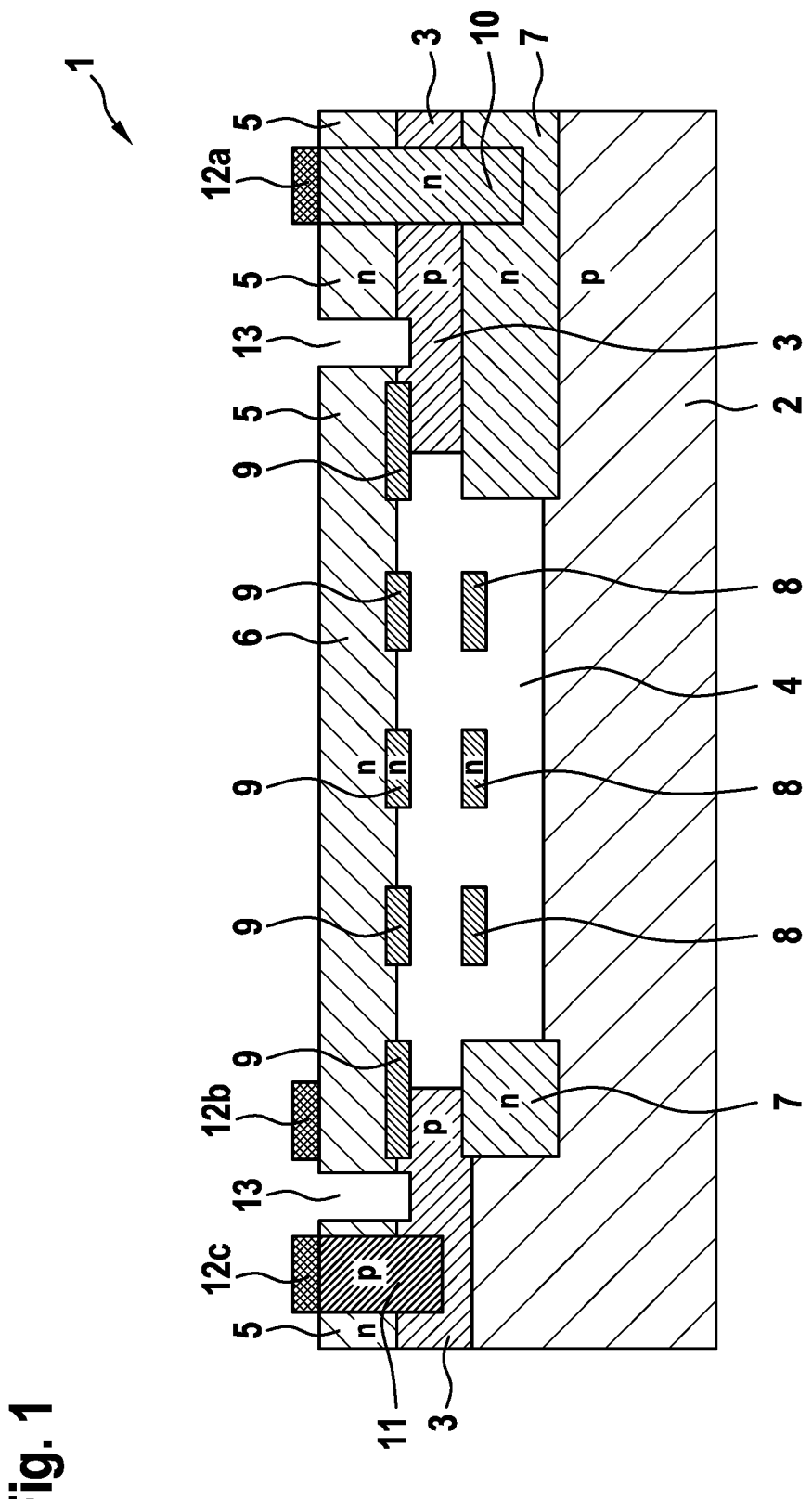
FIG. 1 shows a schematic cross-sectional representation in order to describe a micromechanical pressure sensor device according to a first example embodiment of the present invention.

Identical reference numerals in the figures denote identical or functionally equivalent elements.

FIG. 1 shows a schematic cross-sectional representation in order to describe a micromechanical pressure sensor device according to a first example embodiment of the present invention.

In this instance, micromechanical pressure sensor device 1 is made up of a semiconductor base substrate 2 of a first doping type p on its underside, on which an intermediate layer 3 of the first doping type p is situated. A cavity 4, which is sealed by sealing layer 5 of a second doping type n situated above intermediate layer 3 and which includes a reference pressure, is formed by a recess of a portion of semiconductor base substrate 2 and of intermediate layer 3. A pressure-sensitive diaphragm region 6 is formed by the region of sealing layer 5 situated above cavity 4. A buried connection region 7 of second doping type n is situated in semiconductor base substrate 2, encloses cavity 4 and extends laterally away from it. A first grating 8 of second doping type n is suspended on buried connection region 7. A second grating 9 is situated on the topside of cavity 4. Connected to the lateral part of buried connection region 7 is a first countersink 10 of second doping type n, which extends upward in the vertical direction through intermediate layer 3 and sealing layer 5. A second countersink 11 of first doping type p extends upward from intermediate layer 3 through sealing layer 5. A first connection 12a is connected at the surface to first countersink 10 and thus is electrically connected to first grating 8 via buried connection region 7. A second connection 12b applied on sealing layer 5 is electrically connected to diaphragm region 6, and a third connection 12c is electrically connected to intermediate layer 3 via second countersink 11, and a third connection 12c is electrically connected to intermediate layer 3 via second countersink 11. An insulation trench 13, which penetrates sealing layer 5 in its depth, is situated circumferentially around diaphragm region 6 and thereby insulates first connection 12a from second connection 12b and second connection 12b from third connection 12c.

The connection of a reference potential to second connection 12b causes all junctions between the regions of first doping type p and of second doping type n to have an electrically insulating effect. As a result, first grating 8 is insulated from second grating 9, so that capacitance C may form, which is able to be tapped off using first connection 12a and second connection 12b. With the aid of a corresponding switching circuit, capacitance C is convertible into an electric signal such as a voltage, from which a pressure difference between the external pressure and the reference pressure is able to be detected by the change in capacitance related to the deformation of the diaphragm region.

Doped silicon is preferably selected for semiconductor base substrate 2, intermediate layer 3, sealing layer 5, buried connection region 7, first grating 8, second grating 9, first countersink 10 and second countersink 11. In addition, regions having the first p-doped doping type are preferably selected so that they have electron holes in the valence band. In the process, second countersink 11, in particular, is doped with light atoms such as boron so that it propagates well in the diffusion steps in the production method. Regions of the second doping type are preferably n-doped, i.e., an electron excess is produced. However, it is distinguished here between first countersink 10 and the remaining regions. For example, first countersink 10 preferably receives a doping of light atoms such as phosphorus, while other n-doped regions such as buried connection region 7, first grating 8 and second grating 9 are preferably doped using antimony or arsenic. This is advantageous for process-related reasons because the rate of propagation in the diffusion process is able to be controlled in such a way that the regions doped by light atoms propagate relatively well, while the regions doped by heavy atoms do not propagate at all or only very little. This makes it possible to produce the desired shape of the sensor so that the complete structure of micromechanical pressure sensor device 1 is ultimately made from silicon. In addition to the advantages in terms of production technology such as less waste, such a sensor also has advantages in the temperature response. Only connections 12a, 12b, 12c are preferably made from metal such as aluminum in order to provide the best possible contact with a very low electrical resistance to the external switching circuit.

Figure 2B:
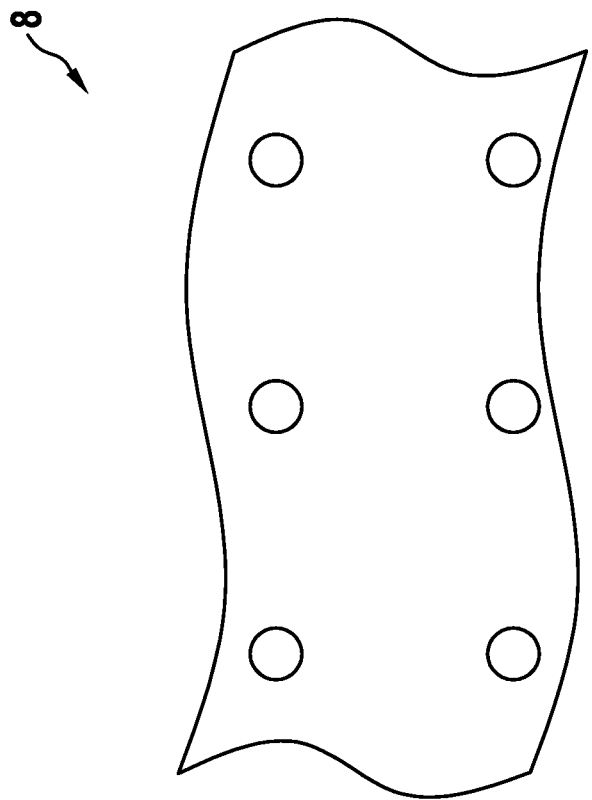
FIGS. 2a)-2k) show schematic representations in order to describe steps in the process method according to the first example embodiment of the present invention, i.e., FIGS. 2a) and 2c)-2k) in cross-section and FIG. 2b) in a top view.

FIGS. 2a)-2k) are schematic cross-sectional representations in order to describe steps in the process method according to the first example embodiment of the present invention, i.e., FIGS. 2a) and 2c)-2k) in cross-section, and FIG. 2b) in a top view.

FIG. 2a shows semiconductor base substrate 2 into which buried connection region 7, first grating 8 and first part 10a of first countersink 10 had been implanted. This process step is preferably carried out using an ion implantation, which encompasses an ion bombardment and a subsequent thermal treatment in order to electrically activate the atoms.

The top view of first grating 8 shown in FIG. 2b illustrates that the holes in this pressure-insensitive first grating 8 have a relatively smaller development than the cohesive regions.

Holes have a diameter of 0.5 μm to 2 μm, preferably 1 μm, and a clearance of 2 μm to 10 μm, preferably 4 μm from one another. The lateral extension of the grating amounts to more than 100 μm, preferably to 300 μm~500 μm.

In the device of FIG. 2c, intermediate layer 3 has been epitaxially grown on semiconductor base substrate 2 and was subsequently diffused out by a diffusion process. It can be seen that first part 10a of first countersink 10 has propagated into intermediate layer 3, while buried connection region 7 and first grating 8 have remained virtually unchanged. This selective diffusion is achieved by the previously mentioned selection of the doping atoms. In the diffusion process, a process temperature of approximately 1000° C. is preferably selected.

Figure 2D:
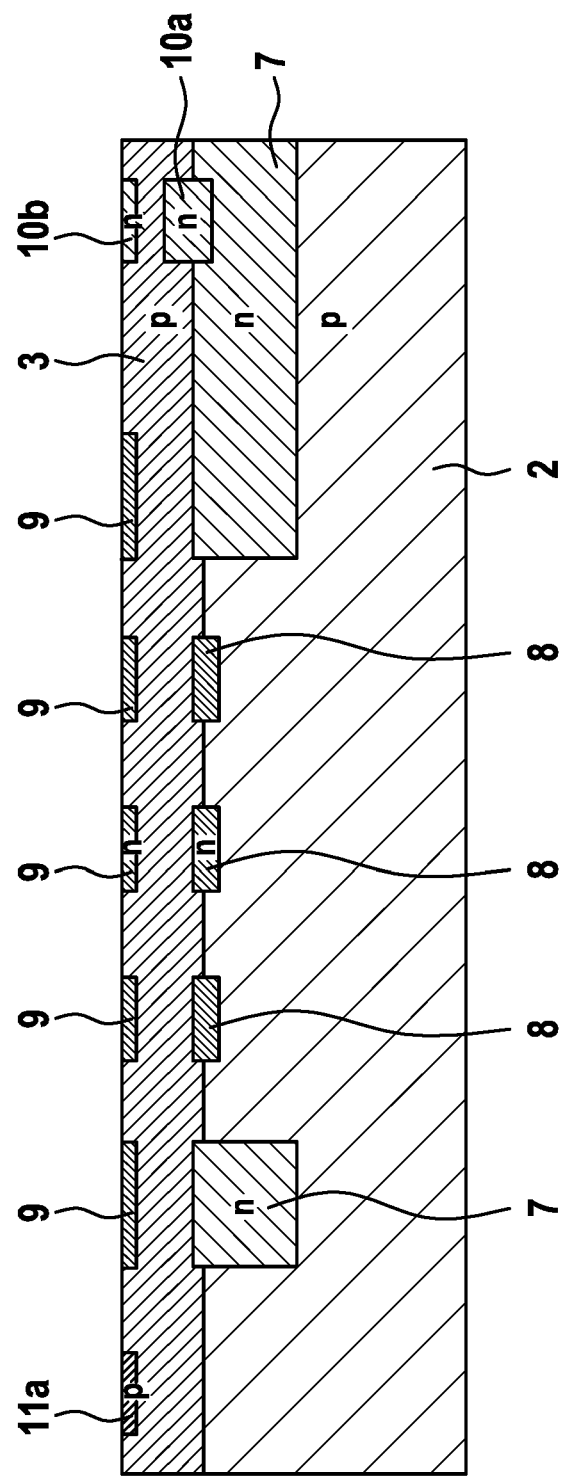

The next method step of implanting second grating 9, second part 10b of first countersink 10 and first part 11a of second countersink 11 is shown in FIG. 2d. This method step is also carried out preferably using an ion implantation.

Figure 2E:
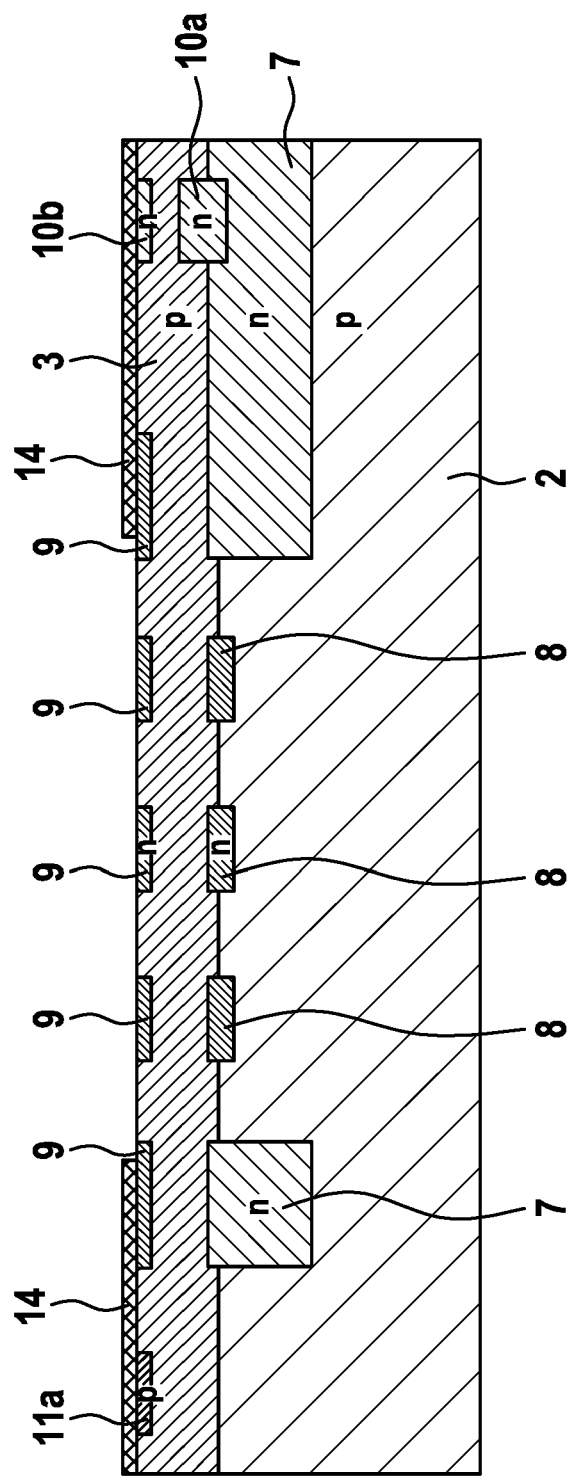

To prepare the APSM process, a mask 14 as shown in FIG. 2e is applied to an external region of the device. Mask 14 is preferably applied by a lithographic method and is preferably made from a nitride.

Figure 2F:
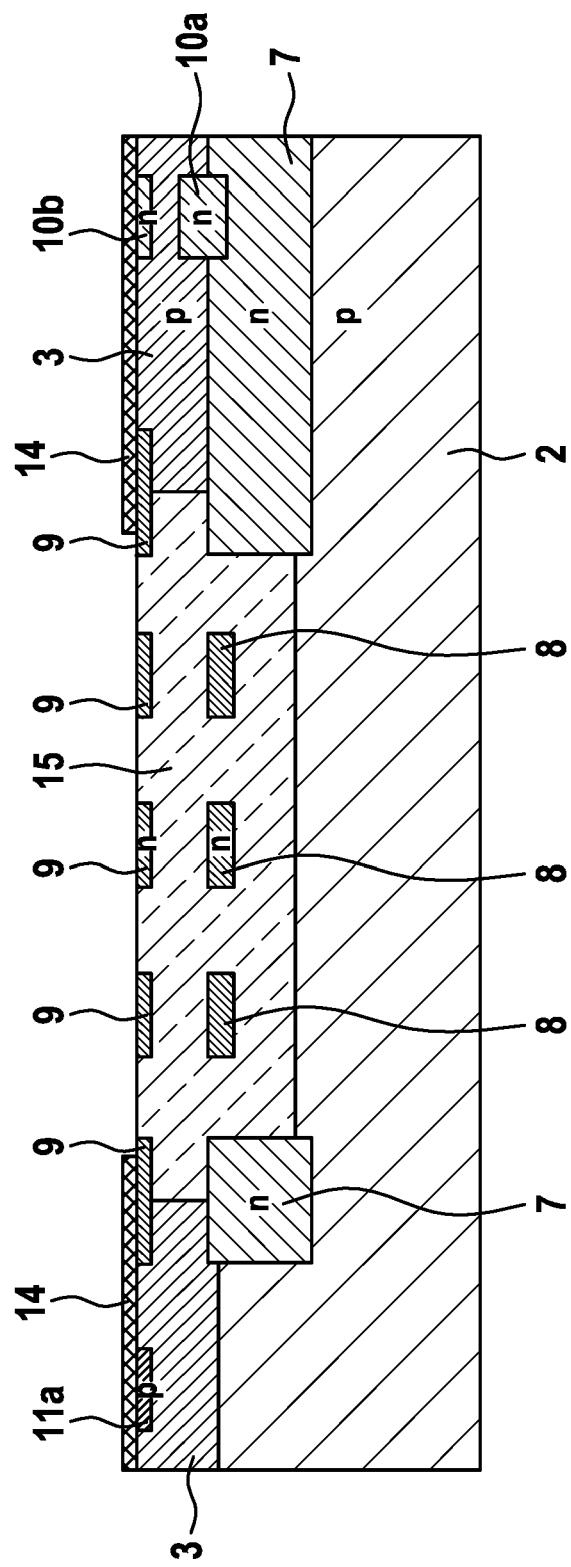

The anodization now causes a porous region 15 to form, as shown in FIG. 2f. It is essentially restricted to regions that were previously not covered by mask 14. Porous region 15 is preferably formed by porous silicon.

Figure 2G:
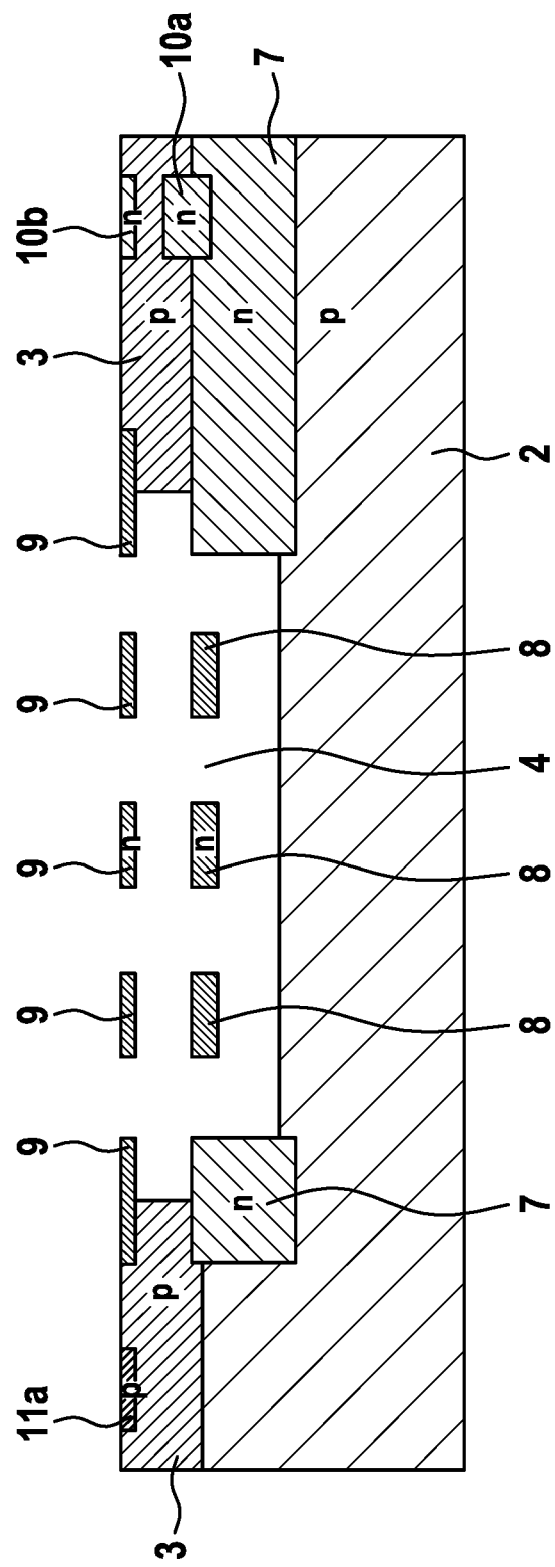

In FIG. 2g, mask 14 was removed and porous region 15 dissolved out in order to form cavity 4. A selective etching process is preferably used for this purpose.

Figure 2H:
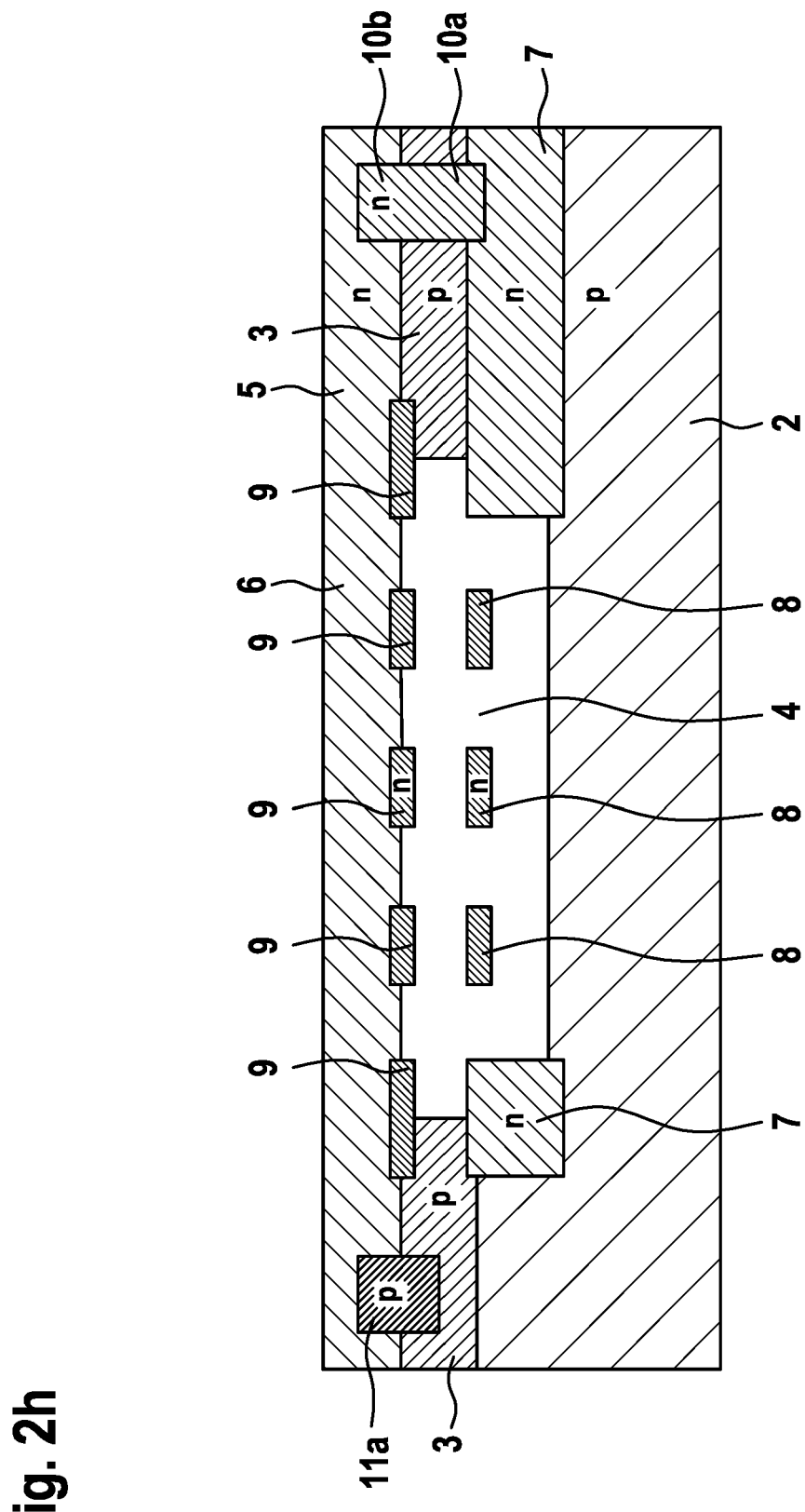

The device after the epitaxial growth of sealing layer 5 and the subsequent out-diffusing is shown in FIG. 2h. During the growth, cavity 4 with the reference pressure is sealed. While second grating 9 remains virtually unchanged during the out-diffusing, both second part 10b of first countersink 10 and first part 11a of second countersink 11 propagate into sealing layer 5. This connects second part 10b of first countersink 10 to first part 10a of first countersink 10. The selective diffusion is achieved by the aforementioned choice of the doping atoms. Preferably, a diffusion process with a process temperature of approximately 1000° C. is selected here as well.

Figure 2I:
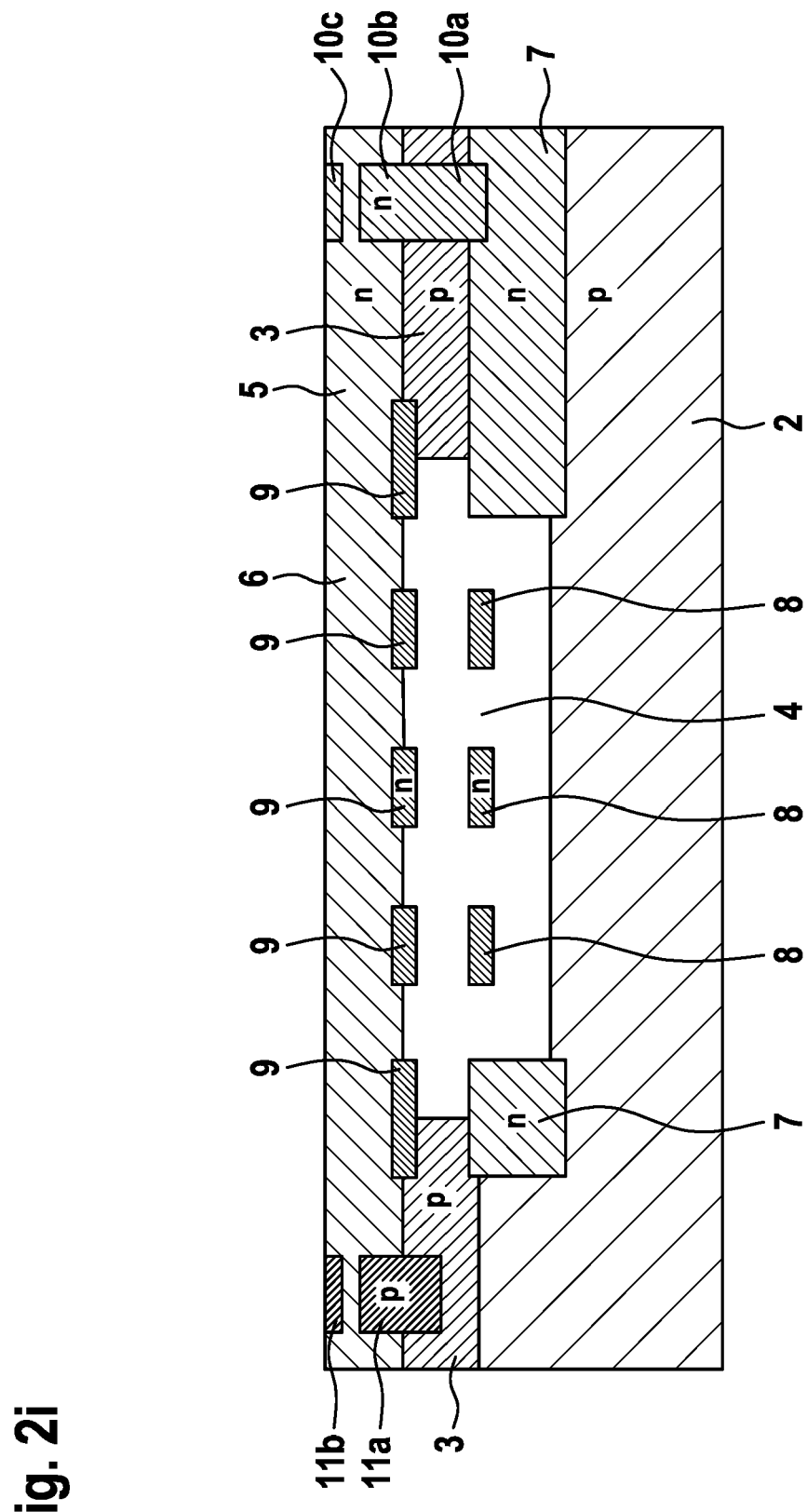

In a next process step, a third part 10c of first countersink 10 and a second part 11b of second countersink 11 is implanted into sealing layer 5, as illustrated in FIG. 2i. Because of the same doping, the implantation of third part 10c of first countersink 10 is optional. Here, too, an ion implantation is preferably used.

Figure 2J:
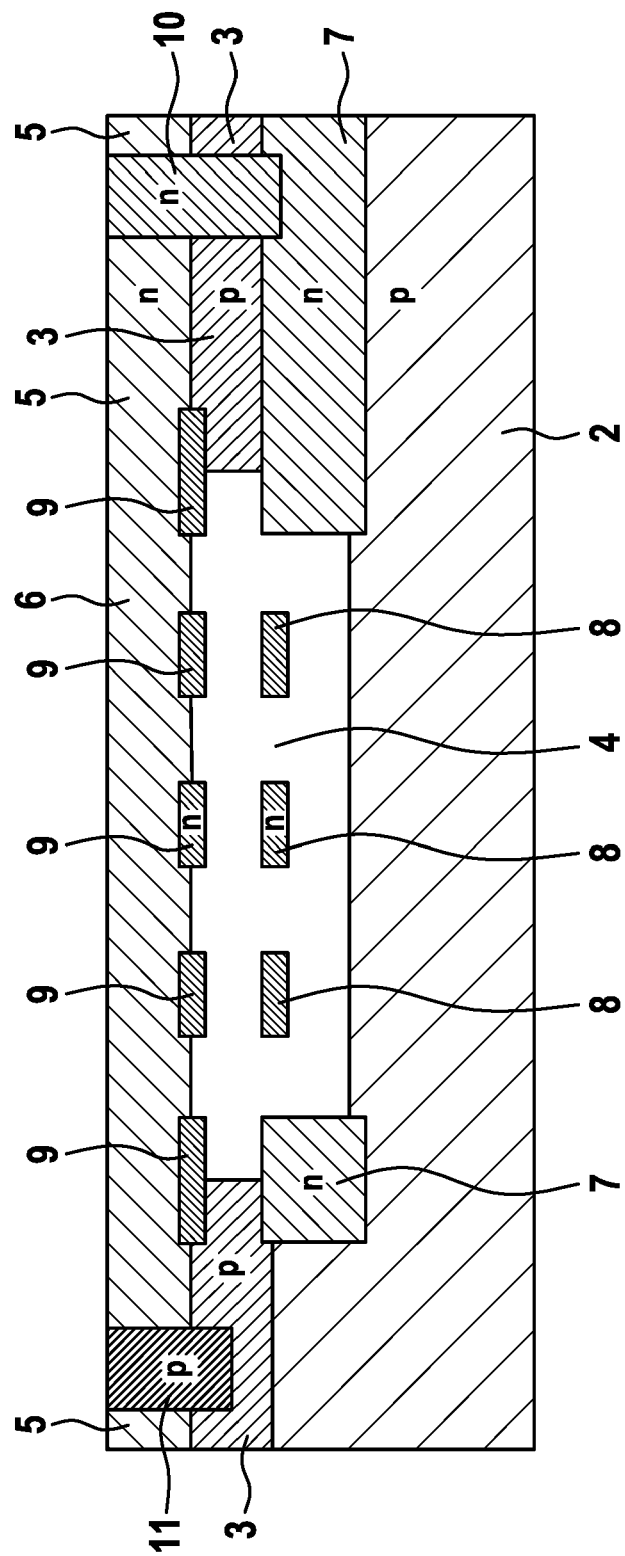

To finish the countersink, a further diffusion process is carried out, as illustrated in FIG. 2j. In this diffusion process, third part 10c of first countersink 10 and second part 11b of second countersink 11 expand further into sealing layer 5. As a result, third part 10c of first countersink 10 connects to second part 10b of first countersink 10, and second part 11b of second countersink 11 connects to first part 11a of second countersink 11. All other doped regions remain virtually unchanged. The selective diffusion is achieved by the selection of the previously already mentioned doping atoms. Here, too, a diffusion process at a process temperature of approximately 1000° C. is preferably selected.

Finally, three connections 12a, 12b, 12c are applied for the contactings, and a first insulation trench 13 is formed circumferentially around diaphragm region 6, as illustrated in FIG. 2k. In this context, the insulation trench insulates first connection 12a from second connection 12b, and second connection 12b from third connection 12c, as previously already described. Connections 12a, 12b, 12c are preferably formed by alu pads, while the insulation trench is produced by an etching process, preferably by alternating etching and passivating.

Figure 3:
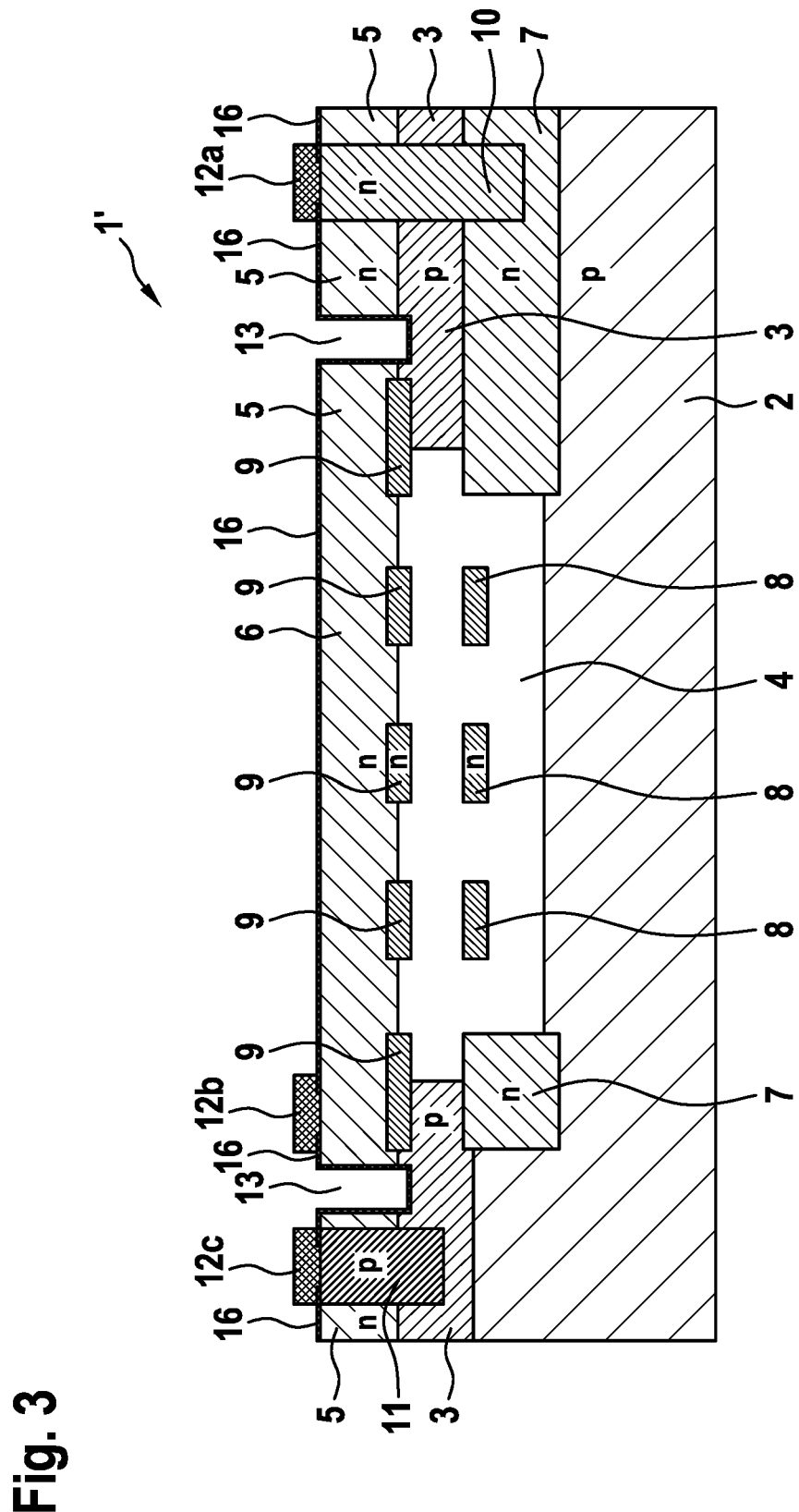
FIG. 3 shows a schematic cross-sectional representation in order to describe a micromechanical pressure sensor device according to a second example embodiment of the present invention.

FIG. 3 is a schematic cross-sectional representation in order to describe a micromechanical pressure sensor device according to a second example embodiment of the present invention.

Micromechanical pressure sensor device 1' of the second embodiment corresponds to the design of the first embodiment, and a protective layer 16 has been inserted on sealing layer 5 and into insulation trench 13. Connections 12a, 12b, 12c have been routed through protective layer 16 in order to remain electrically connected to the respective layers. Protective layer 16 is preferably formed from a nitride and offers protection from environmental effects, if such a protection is required.

Figure 4:
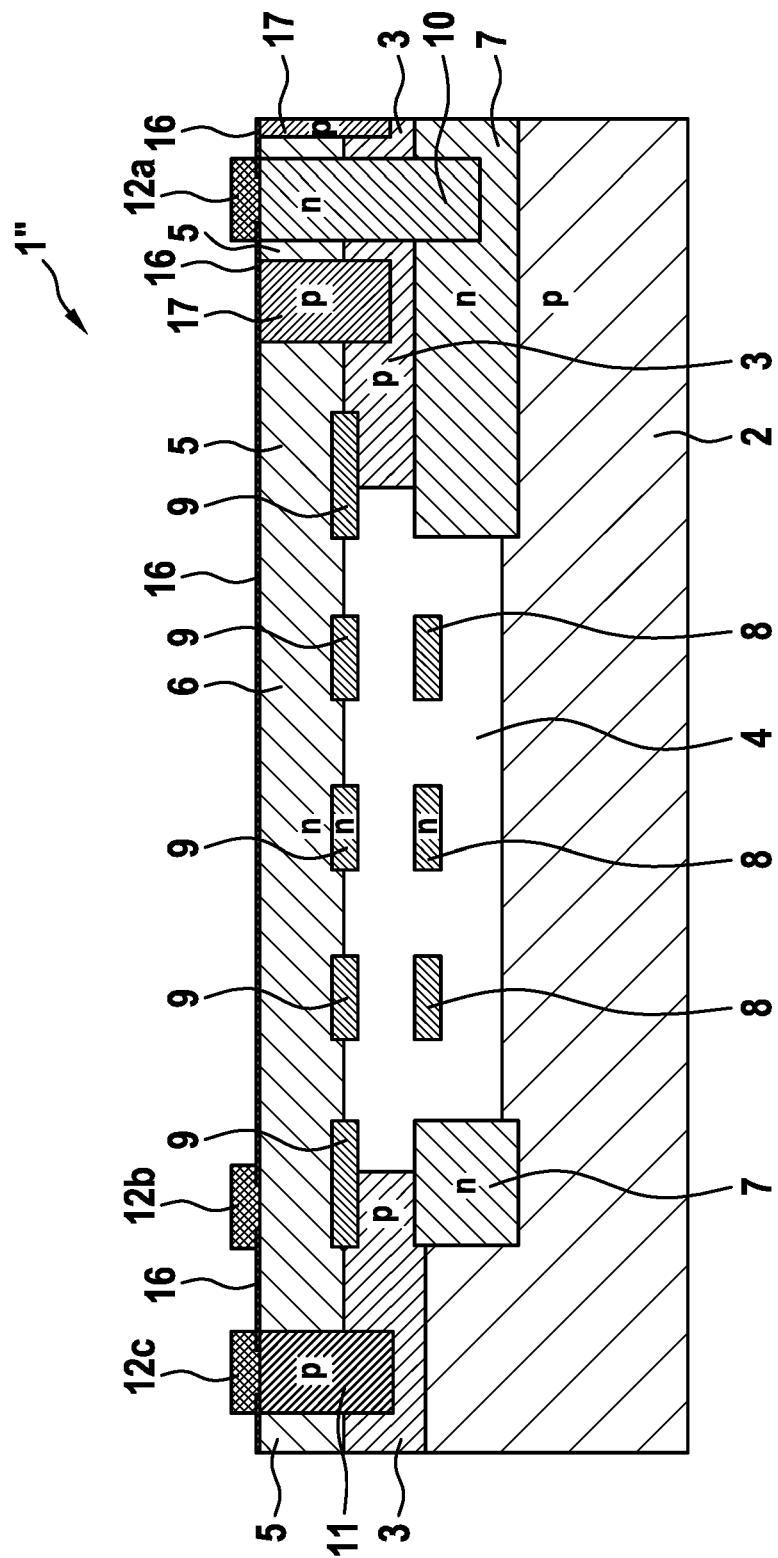
FIG. 4 shows a schematic cross-sectional representation in order to describe a micromechanical pressure sensor device according to a third example embodiment of the present invention.

FIG. 4 is a schematic cross-sectional representation in order to describe a micromechanical pressure sensor device according to a third example embodiment of the present invention.

Micromechanical pressure sensor device 1" of the third embodiment corresponds to the design of the second embodiment, insulation trench 13 having been replaced by a third countersink 17 of the first doping type p, which is situated around first countersink 10 having first connection 12a. Third countersink 17 electrically insulates first connection 12a from second connection 12b and thus constitutes an alternative solution to the insulation trench.

Figure 5:
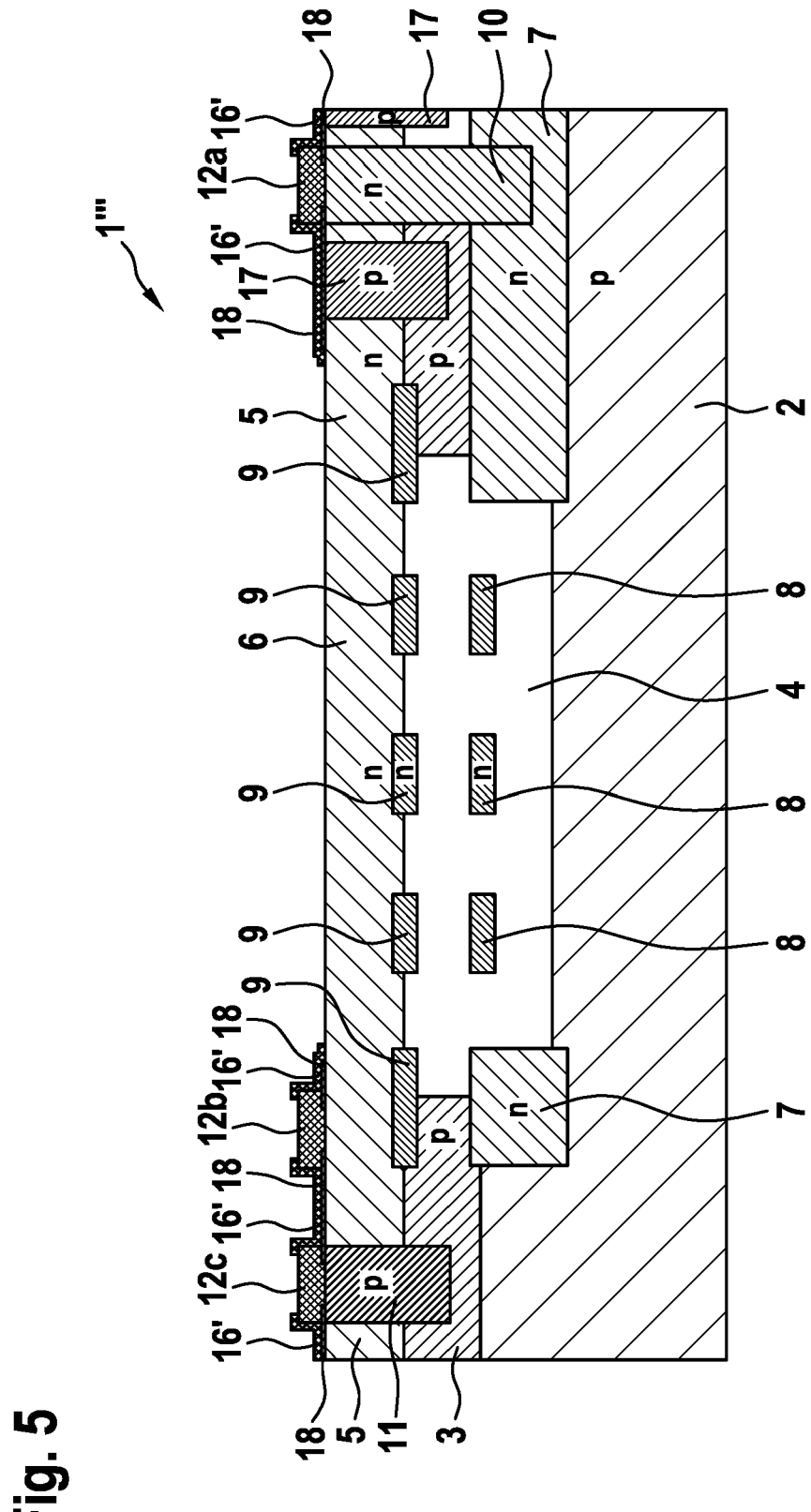
FIG. 5 shows a schematic cross-sectional representation in order to describe a micromechanical pressure sensor device according to a fourth example embodiment of the present invention.

FIG. 5 is a schematic cross-sectional view to describe a micromechanical pressure sensor device according to a fourth example embodiment of the present invention.

Micromechanical pressure sensor device 1'" of the fourth embodiment corresponds to the third embodiment in terms of its design, protective layer 16' being present only in the external region, in particular outside of diaphragm region 6, of the pressure sensor, but also covers the edges of the connections. In addition, an insulation layer is situated between protective layer 16' and sealing layer 5. This system ensures that no undesired currents are created at connections 12a, 12b, 12c, which would have an adverse effect on the measuring results. The covering of the edges of connections 12a, 12b, 12c by protective layer 16' also prevents an oxidation of the metal. A nitride is preferably selected for protective layer 16', and an oxide for insulation layer 18'.

Figure 6:
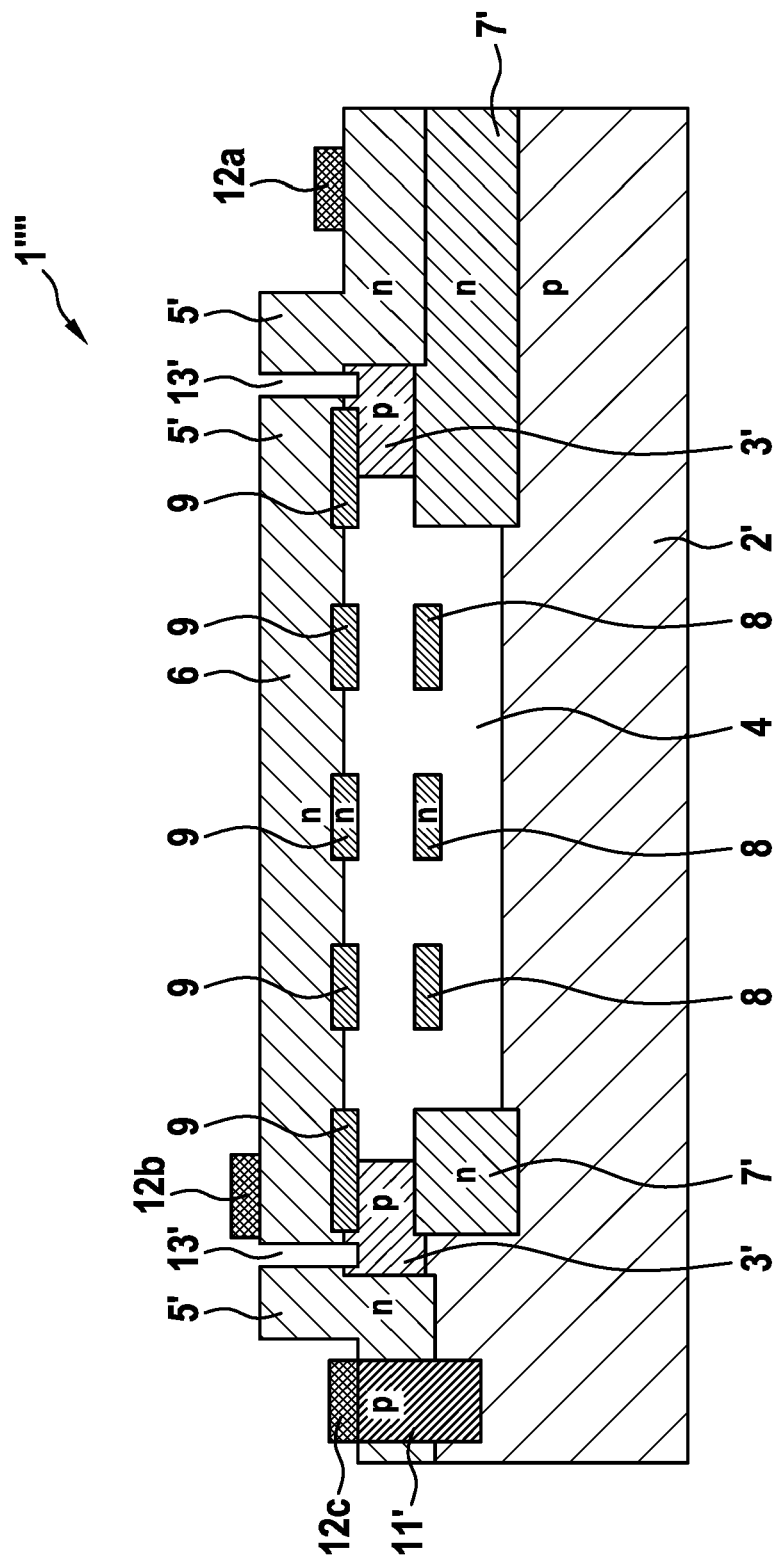
FIG. 6 shows a schematic cross-sectional representation in order to describe a micromechanical pressure sensor device according to a fifth example embodiment of the present invention.

FIG. 6 is a schematic cross-sectional representation in order to describe a micromechanical pressure sensor device according to a fifth example embodiment of the present invention.

Micromechanical pressure sensor device 1"" of the fifth embodiment corresponds to the design of the first embodiment, intermediate layer 3' having been structured on the side of cavity 4 down to semiconductor substrate 2' and to buried connection region 7', so that sealing layer 5' is in direct contact with buried connection region 7'. Insulation trench 13' is furthermore situated circumferentially to diaphragm region 6 and insulates second connection 12b of the diaphragm region from first connection 12a and from third connection 12c. Second countersink 11' extends from semiconductor base substrate 2' through sealing layer 5' so that third connection 12c is electrically connected to intermediate layer 3' via second countersink 11' and semiconductor base substrate 2'.

Although the present invention has been described based on preferred exemplary embodiments, it is not restricted thereto. More specifically, the mentioned materials and topologies are merely of an exemplary nature and not restricted to the described examples.

In particular, different angles of inclination, geometries, etc. are able to be selected for the individual elements.

What is claimed is:

1. A micromechanical pressure sensor device, comprising:
a semiconductor base substrate of a first doping type, on which an intermediate layer of the first doping type is situated;
a cavity, which includes a recess of a subregion of the semiconductor base substrate and a recess of the intermediate layer;
a sealing layer, the cavity being sealed by a sealing layer of a second doping type and containing a reference pressure, the sealing layer having a diaphragm region situated on a topside of the cavity;
a first grating of the second doping type, which is suspended on a buried connection region of the second doping type, the buried connection region extending laterally away from the cavity into the semiconductor base substrate;
a second grating of the second doping type, which is situated on a side of the diaphragm region pointing to the cavity and is suspended on the diaphragm region, the first grating and the second grating being electrically insulated from each other and forming a capacitance;
a first connection electrically connected to the first grating via the buried connection region; and
a second connection electrically connected to the second grating;
wherein a pressure change between an external pressure and the reference pressure is able to be detected by a capacitance change between the first connection and the second connection.

2. The micromechanical pressure sensor device as recited in claim 1, wherein a first countersink of the second doping type extends from the buried connection region through the intermediate layer and electrically connects the first connection to the first grating.

3. The micromechanical pressure sensor device as recited in claim 1, wherein a second countersink of the first doping type extends from the intermediate layer through the sealing layer and electrically connects a third connection to the intermediate layer.

4. The micromechanical pressure sensor device as recited in claim 1, wherein a first insulation trench is situated circumferentially around the diaphragm region and electrically insulates the first connection from the second connection.

5. The micromechanical pressure sensor device as recited in claim 1, wherein a third countersink of the first doping type is situated circumferentially around the diaphragm region or around the second countersink, the third countersink electrically insulating the first connection from the second connection.

6. The micromechanical pressure sensor device as recited in claim 3, wherein a second insulation trench is situated circumferentially around the second countersink and electrically insulates the first connection from the second connection.

7. The micromechanical pressure sensor device as recited in claim 1, wherein a protective layer is situated on the sealing layer, and the first and second connections are routed through the protective layer.

8. The micromechanical pressure sensor device as recited in claim 7, wherein an insulation layer is situated between the sealing layer and the protective layer, and the first and second connections are routed through the protective layer and the insulation layer.

9. The micromechanical pressure sensor device as recited in claim 8, wherein the protective layer and the insulation layer are situated outside the diaphragm region on the sealing layer.

10. The micromechanical pressure sensor device as recited in claim 2, wherein the first countersink is phosphorus doped, and the buried connection region, the first grating and the second grating are antimony doped or arsenic doped.

11. The micromechanical pressure sensor device as recited in claim 1, wherein the diaphragm region is formed from monocrystalline silicon.

12. A method for producing a micromechanical pressure sensor device, the micromechanical pressure sensor device including a semiconductor base substrate of a first doping type, on which an intermediate layer of the first doping type is situated; a cavity, which includes a recess of a subregion of the semiconductor base substrate and a recess of the intermediate layer; a sealing layer, the cavity being sealed by a sealing layer of a second doping type and containing a reference pressure, the sealing layer having a diaphragm region situated on a topside of the cavity; a first grating of the second doping type, which is suspended on a buried connection region of the second doping type, the buried connection region extending laterally away from the cavity into the semiconductor base substrate; a second grating of the second doping type, which is situated on a side of the diaphragm region pointing to the cavity and is suspended on the diaphragm region, the first grating and the second grating being electrically insulated from each other and forming a capacitance; a first connection electrically connected to the first grating via the buried connection region; and a second connection electrically connected to the second grating; wherein a pressure change between an external pressure and the reference pressure is able to be detected by a capacitance change between the first connection and the second connection, the method comprising the following steps:
providing the semiconductor base substrate of the first doping type;
implanting the first grating of the second doping type and the buried connection region of the second doping type into the semiconductor base material;
epitaxially growing the intermediate layer of the first doping type;
implanting the second grating of the second doping type;
applying a mask;
forming a porous region using the mask;
removing the mask;
dissolving out the porous region;
epitaxially growing the sealing layer of the second doping type to form the cavity;
applying the first connection, which is electrically connected to the first grating via the buried connection region; and
applying the second connection, which is electrically connected to the second grating.

13. The method as recited in claim 12, wherein the micromechanical pressure sensor device further includes a first countersink of the second doping type which extends from the buried connection region through the intermediate layer and electrically connects the first connection to the first grating, and the method further comprises the following steps:
implanting a first part of the first countersink on a laterally extending part of the buried connection region;
out-diffusing the first part of the first countersink within the buried connection region and into the intermediate layer;
implanting a second part of the first countersink into the intermediate layer above the first part of the first countersink; and
out-diffusing the second part of the first countersink within the intermediate layer and into the sealing layer.

14. The method as recited in claim 12, wherein the micromechanical pressure sensor device further includes a second countersink of the first doping type which extends from the intermediate layer through the sealing layer and electrically connects a third connection to the intermediate layer, and the method further comprises the following steps:
implanting a first part of the second countersink on the intermediate layer;
out-diffusing the first part of the second countersink within the intermediate layer and into the sealing layer;
implanting a second part of the second countersink into the sealing layer above the first part of the second countersink; and
out-diffusing the second part of the second countersink within the sealing layer.

* * * * *